United States Patent
Kim et al.

(10) Patent No.: US 10,937,925 B2
(45) Date of Patent: Mar. 2, 2021

(54) LIGHT EMITTING DIODE CHIP HAVING DISTRIBUTED BRAGG REFLECTOR

(71) Applicant: Seoul Viosys Co., Ltd., Ansan-si (KR)

(72) Inventors: Ye Seul Kim, Ansan-si (KR); Kyoung Wan Kim, Ansan-si (KR)

(73) Assignee: Seoul Viosys Co., Ltd.

(*) Notice: Subject to any disclaimer, the term of this patent is extended or adjusted under 35 U.S.C. 154(b) by 11 days.

(21) Appl. No.: 16/426,205

(22) Filed: May 30, 2019

(65) Prior Publication Data

US 2019/0371967 A1 Dec. 5, 2019

(30) Foreign Application Priority Data

May 30, 2018 (KR) .................. 10-2018-0061744

(51) Int. Cl.
 *H01L 33/10* (2010.01)
 *H01L 33/32* (2010.01)
 *H01L 33/46* (2010.01)

(52) U.S. Cl.
 CPC .............. *H01L 33/10* (2013.01); *H01L 33/32* (2013.01)

(58) Field of Classification Search
 CPC .......... H01L 33/10; H01L 33/32; H01L 33/46
 USPC ........................................................ 257/98
 See application file for complete search history.

(56) References Cited

U.S. PATENT DOCUMENTS

| 8,314,440 B2 | 11/2012 | Heo et al. |
| 2019/0067526 A1* | 2/2019 | Kim .................. H01L 33/46 |

FOREIGN PATENT DOCUMENTS

| DE | 202011110910 | 4/2017 |
| KR | 10-1289442 | 7/2013 |
| WO | 2017069372 | 4/2017 |

* cited by examiner

*Primary Examiner* — Fazli Erdem
(74) *Attorney, Agent, or Firm* — H.C. Park & Associates, PLC

(57) ABSTRACT

A light emitting diode chip including a light emitting structure and a distributed Bragg reflector (DBR) disposed thereon to reflect light, the DBR includes alternatively stacked first material layers having a low refractive index and second material layers having a high refractive index, and, with respect to a peak wavelength λ of light emitted, the DBR includes a first region having pairs of the first and second material layers each having an optical thickness greater than 0.25λ and less than 0.3λ, a last pair of the first and second material layers disposed farthest from the light emitting structure, and a second region between the first region and the last pair, each of the material layers in the second region has an optical thickness less than 0.25λ, and the first material layers have a greater optical thickness deviation than that of the second material layers in the second region.

20 Claims, 7 Drawing Sheets

LIGHT EMITTING DIODE CHIP HAVING DISTRIBUTED BRAGG REFLECTOR

CROSS REFERENCE TO RELATED APPLICATION

This application claims priority from and the benefit of Korean Patent Application No. 10-2018-0061744, filed on May 30, 2018, which is hereby incorporated by reference for all purposes as if fully set forth herein.

BACKGROUND

Field

Exemplary embodiments of the invention relate generally to a light emitting diode chip and, more particularly, to a light emitting diode chip including a distributed Bragg reflector with improved light extraction efficiency.

Discussion of the Background

A GaN-based light emitting diode emitting blue light or UV light is used in various applications. In addition, various types of commercially available light emitting diode packages may emit mixed light, for example, white light, and be used as a backlight unit or general lighting.

Since light output of a light emitting diode package generally depends on luminous efficacy of a light emitting diode chip, continuous attempts have been made to improve luminous efficacy of the light emitting diode chip. For example, a roughened surface is formed on one surface of a light exit plane, or the shape of an epitaxial layer or a transparent substrate is modified in order to improve light extraction efficiency of the light emitting diode chip.

Alternatively, a metal reflector, for example, an Al reflector, is provided to the other surface of the light exit plane, for example, a lower surface of a substrate, in order to improve luminous efficacy through reflection of light traveling towards a chip mounting surface. Luminous efficacy of the light emitting diode chip can be improved by reducing light loss through reflection of light using the metal reflector. A metal reflector, such as Al, provides an even reflectance for incident light of various wavelengths, but the reflectance of the metal reflector may be deteriorated from oxidation or the like, and may have relatively low reflectance with the passage of time.

Accordingly, a distributed Bragg reflector (DBR) formed by alternately stacking materials having different refractive indices is used to achieve high reflectance while securing relatively stable reflection characteristics.

The DBR is generally formed by alternately stacking high refractive material layers and low refractive material layers. More particularly, a DBR having high reflectance in a certain spectrum range including a central wavelength, that is, in a stop band, can be formed by alternately stacking high refractive material layers and low refractive material layers each having an optical thickness (actual thickness×refractive index) of approximately $\lambda/4$ ($\lambda$: central wavelength) with respect to the central wavelength.

The DBR generally uses $TiO_2$ as a high refractive material layer and $SiO_2$ as a low refractive material layer. However, an extinction coefficient of the high refractive material layer, such as $TiO_2$, tends to increase sharply as the wavelength decreases. FIG. 1 shows a typical extinction coefficient of $TiO_2$ depending on wavelengths. As shown in FIG. 1, at a wavelength of about 400 nm or less, the extinction coefficient of $TiO_2$ increases sharply as the wavelength becomes shorter.

FIG. 2 shows a typical emission spectrum of a light emitting diode chip having a peak wavelength of 400 nm. Even for a light emitting diode chip that targets a specific wavelength, the emission spectrum of the light emitting diode chip generally shows a half-width of 10 nm or more, and the light emitting diode chip emits light over a wavelength range of about 65 nm or more. As such, the light emitting diode chip that targets the peak wavelength of 400 nm may require a reflector that may have a high reflectance even for light having a shorter wavelength than 400 nm.

In this case, it is difficult to design the DBR suitable for the light emitting diode chip emitting visible light of short wavelength of about 440 nm or less, or near-ultraviolet light of shorter wavelength (about 300 nm to about 400 nm). For example, to increase the reflectance, the number of layers of the high refractive material layer and the low refractive material layer should be increased. However, increasing the number of high refractive material layer increases light absorption, which may lower total reflectance. As such, metal reflectors having a low reflectance in short wavelength visible light or near ultraviolet light emitting diode chips are still being used to increase the efficiency of light emitting diode chip.

When a GaN-based light emitting structure including an active layer is formed on a sapphire substrate, and a DBR is provided to a lower surface of the substrate, some of light emitted from the active layer reaches the reflector after passing through the substrate. In this case, light enters the reflector not only at an incident angle of 0° (at a right angle with respect to the reflector), but also at various incident angles. More particularly, when the sapphire substrate is a patterned sapphire substrate, the amount of light incident at an inclined angle may be greater than that incident at a right angle.

FIG. 3 is a graph depicting light output depending upon incident angle of light reaching a lower surface of a substrate. In this graph, "Ex" indicates an incident angle in the X direction on the lower surface of the substrate, and "Ez" indicates an incident angle in the Z direction perpendicular to the X direction on the lower surface of the substrate. Based on actual dimensions of a light emitting diode chip including a patterned sapphire substrate, light output depending upon the incident angle of light reaching the lower surface of the substrate was analyzed at intervals of 10° by finite-difference time-domain (FDTD) numerical analysis.

Referring to FIG. 3, a light output of light incident generally at a right angle on the lower surface of the substrate, more particularly, at an incident angle of 0° to 10°, is less than about 3.5%. A light output of light incident at an angle of 20° or more, more particularly, at an incident angle in a range of 20° to 50°, is about 60% or higher, which occupies the most portion of light reaching the lower surface of the substrate. In the patterned sapphire substrate (PSS), light is scattered by a pattern formed on the substrate, thereby increasing the incident angle of light reaching the lower surface of the substrate. Accordingly, in the patterned sapphire substrate (PSS), since substantial amounts of light reach the lower surface of the substrate at a relatively high incident angle, the DBR for reflecting light incident on the lower surface of the substrate should take the incident angle of light into account.

The above information disclosed in this Background section is only for understanding of the background of the inventive concepts, and, therefore, it may contain information that does not constitute prior art.

SUMMARY

Devices constructed according to exemplary embodiments of the invention improve luminous efficacy of a light emitting diode chip by including a DBR structure.

Exemplary embodiments also provide a light emitting diode chip including a DBR having a high reflectance even for light incident at various incident angles.

Exemplary embodiments further provide a light emitting diode chip capable of mitigating light loss from light absorption by the DBR.

Additional features of the inventive concepts will be set forth in the description which follows, and in part will be apparent from the description, or may be learned by practice of the inventive concepts.

A light emitting diode chip including a light emitting structure including an active layer, and a distributed Bragg reflector (DBR) disposed on one side of the light emitting structure to reflect light emitted from the light emitting structure, the DBR including first material layers having a low refractive index and second material layers having a high refractive index alternately disposed one over another, in which, with respect to a peak wavelength λ of light emitted from the light emitting structure, the DBR includes a first region including a plurality of pairs of the first and second material layers each having an optical thickness greater than 0.25λ and less than 0.3λ, a last pair of the first and second material layers disposed farthest from the light emitting structure, and a second region disposed between the first region and the last pair, each of the first material layers and the second material layers in the second region has an optical thickness less than 0.25λ, the first region is disposed closer to the light emitting structure than the second region, and the first material layers in the second region have a greater optical thickness deviation than that of the second material layers in the second region.

One of the pairs in the first region may have a first material layer thicker than a second material layer, and another one of the pairs has a first material layer thinner than a second material layer.

At least one of the first material layers in the second region may have an optical thickness greater than 0.25λ–20%, and at least one of the first material layers in the second region may have an optical thickness less than 0.25λ–40%.

The second material layers in the second region may have optical thicknesses greater than 0.25λ–10%.

The at least one of the first material layers in the second region having the optical thickness greater than 0.25λ–20% may have an optical thickness greater than 0.25λ–10%.

The optical thickness deviation of the second material layers in the second region may be smaller than that of the second material layers in the first region.

The first material layer of the last pair may be thicker than the first material layers in the first and second regions.

The first material layer of the last pair may have a thickness in a range of about 80 nm to about 200 nm.

The number of pairs in the first region may be in a range of 6 to 10.

The number of pairs in the second region may be ½ or less of the number of pairs in the first region.

The light emitting diode chip may further include a substrate disposed between the light emitting structure and the DBR.

The substrate comprises a patterned sapphire substrate (PSS).

The light emitting diode chip may further include an interface layer disposed between the substrate and the DBR, the interface layer including substantially the same material as the first material layers and has a greater thickness than the first material layers.

The light emitting diode chip may further include a metal reflector contacting the last pair of the DBR.

The light emitting diode chip may further include a substrate, in which the light emitting structure may be interposed between the DBR and the substrate.

The light emitting structure may be configured to emit visible light or near ultraviolet light having a peak wavelength of 440 nm or less.

The first material layers may include $SiO_2$ layers and the second material layers may include $TiO_2$ layers.

A stop band width of the DBR may be in a range of about 100 nm to about 200 nm.

A light emitting diode chip according to another exemplary embodiment includes a light emitting structure, and a distributed Bragg reflector (DBR) disposed on the light emitting structure and comprising a plurality first material layers and second material layers alternatively disposed one over another, each of the second material layers has a greater refractive index than the first material layers, in which the DBR sequentially includes a first region, a second region, and a third region, the first region being disposed closer to the light emitting structure than the second and third regions, each of the first, second, and third regions includes at least one pair of first and second material layers, each of the first material layers in the second region has an optical thickness less than those of the first material layers in the first and third regions, and each of the second material layers in the second region has an optical thickness less than those of the second material layers in the first and third regions.

The first material layer having the greatest optical thickness may be disposed in the third region, and the second material layer having the greatest optical thickness may be disposed in the first region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
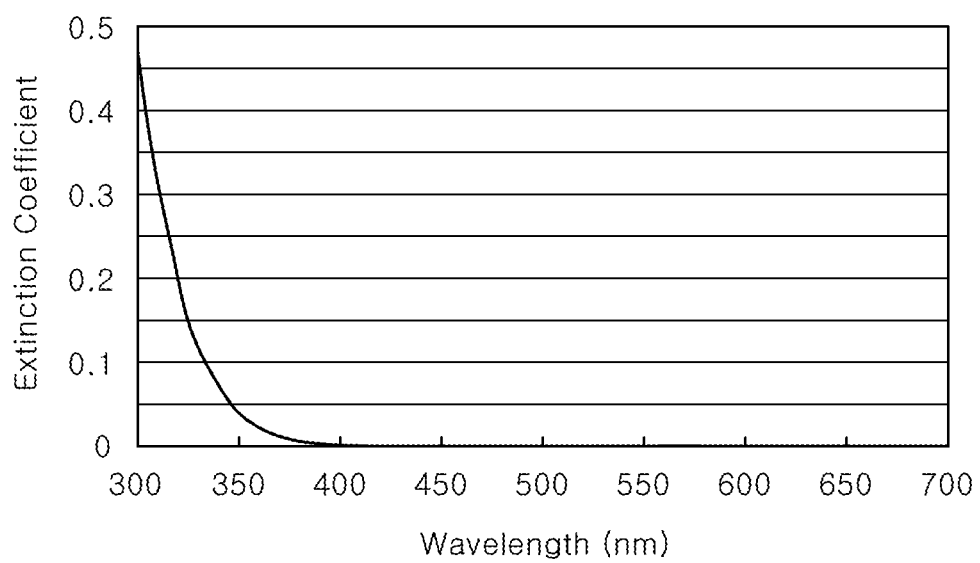
FIG. 1 is a graph depicting a typical extinction coefficient of $TiO_2$ depending on wavelengths.
Figure 2:
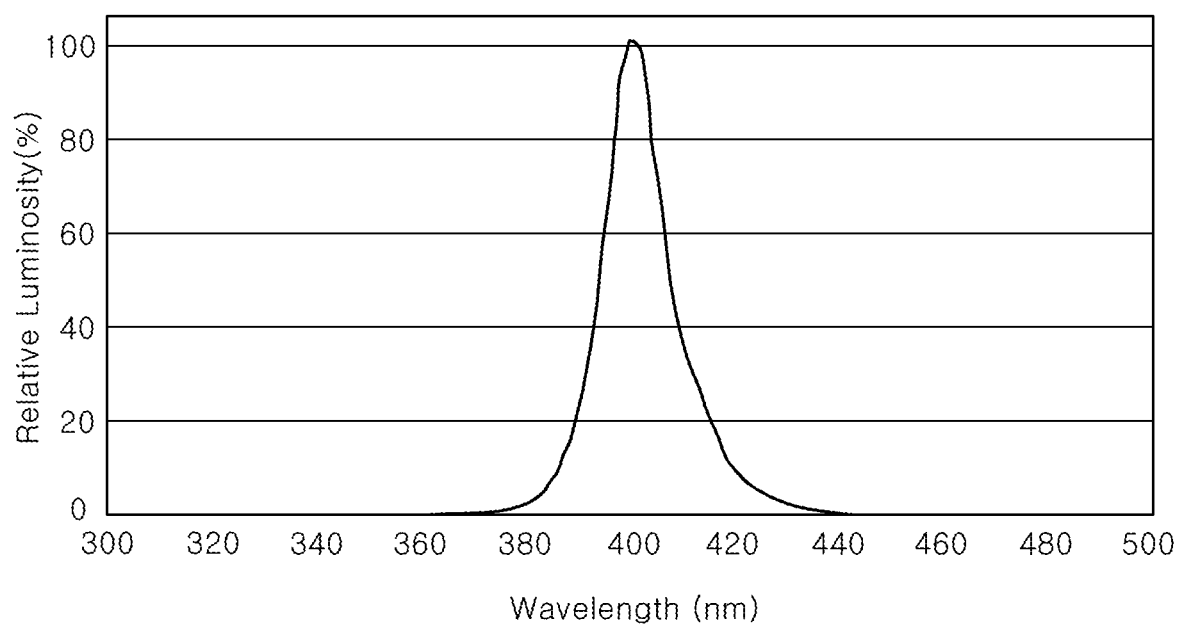
FIG. 2 is a graph depicting a typical emission spectrum of a light emitting diode chip.
Figure 3:
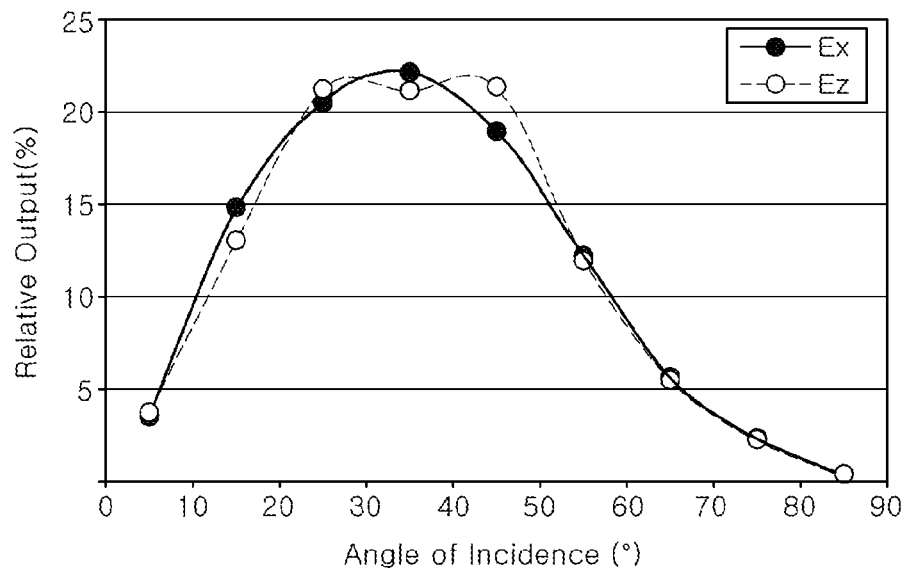
FIG. 3 is a graph depicting light output upon incident angle of light reaching a lower surface of a substrate.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc. of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A light emitting diode chip according to an exemplary embodiment includes a light emitting structure including an active layer, and a distributed Bragg reflector (DBR) disposed on one side of the light emitting structure to reflect light emitted from the light emitting structure. The DBR includes pairs of first material layers having a low refractive index, and second material layers having a high refractive index, the first and second material layers being alternately stacked one above another. With respect to a peak wavelength $\lambda$ of light emitted from the light emitting structure, the DBR include a first region including a plurality of pairs, in which the first material layers and the second material layers both have an optical thickness greater than 0.25$\lambda$ and less than 0.3$\lambda$, a last pair farthest from the light emitting structure, and a second region located between the first region and the last pair, in which the first material layers and the second material layers both have an optical thickness less than 0.25$\lambda$. The first region is located closer to the light emitting structure than the second region, and the first material layers in the second region have a larger optical thickness deviation than that of the second material layers.

As used herein, the term "optical thickness" refers to a value obtained by multiplying an actual (physical) thickness of the material layer by the refractive index of the material layer with respect to the wavelength of light emitted from the light emitting structure.

In addition, the term "optical thickness deviation" refers to a difference between the maximum optical thickness and the minimum optical thickness in the same region.

By setting the optical thicknesses of the first material layers and the second material layers in the first region within a range of 0.25$\lambda$ to 0.3$\lambda$, the DBR according to an exemplary embodiment may have a high reflectance with respect to light incident at various incident angles. Furthermore, by setting the optical thicknesses of the first material layers and the second material layers in the second region to be smaller than 0.25$\lambda$, the reflectance of the DBR according to an exemplary embodiment may be increased, and light absorption by each of the material layers of the DBR may be mitigated. In addition, the second region can prevent occurrence of ripples in the stop band even when the incident angle of the light incident on the DBR is changed.

In an exemplary embodiment, the first region may include a pair, in which a first material layer is thicker than a second material layer, and another pair of a first material layer thinner than a second material layer.

The first material layers in the second region may have a first material layer having an optical thickness less than 0.25$\lambda$ and greater than 0.25$\lambda$–20%, and a first material layer having an optical thickness less than 0.25$\lambda$–40%. The second material layers in the second region may have optical thicknesses less than 0.25$\lambda$ and greater than 0.25$\lambda$–10%. Further, the first material layer having the optical thickness greater than 0.25$\lambda$–20% may have an optical thickness greater than 0.25$\lambda$–10%.

By setting the optical thickness deviation of the first material layers in the second region greater than that of the second material layers in the second region, it is possible to increase the reflectance of the DBR and improve stability during the process of forming the DBR.

The optical thickness deviation of the second material layers in the second region may be smaller than that of the second material layers in the first region. More particularly, the second material layers in the second region may be formed to have relatively even optical thicknesses. Accordingly, it is possible to simplify the process of forming the second material layers having relatively thin thicknesses, and thus, the stability during a process of manufacturing the light emitting diode chip may be improved.

The first material layer of the last pair may be thicker than the other first material layers in the DBR. For example, the first material layer of the last pair may have a thickness in a range of 80 nm to 200 nm, and more specifically, in a range of 90 nm to 120 nm.

The number of pairs of the first region may be set as, for example, 6 to 10 pairs, to reduce light loss by the second material layers. In addition, the number of pairs in the second region may be ½ or less of the number of pairs in the first region. Accordingly, it is possible to reduce the total thickness of the first material layers and the second material layers forming the DBR, thereby reducing light loss due to the light absorption of the DBR.

In an exemplary embodiment, the light emitting diode chip may further include a substrate disposed between the light emitting structure and the DBR. The substrate may be a patterned sapphire substrate (PSS).

The light emitting diode chip may further include an interface layer disposed between the substrate and the DBR, which may be formed of substantially the same material as the first material layers in the DBR, in which the interface layer has a greater thickness than the first material layers. The interface layer may reduce the influence of a rough bottom surface of the substrate to the DBR, which may be formed on the bottom surface of the substrate.

The light emitting diode chip may further include a metal reflector contacting the last pair of the DBR. Since the metal reflector has the high reflectance over a wide wavelength range, the metal reflector may reflect not only light emitted from the light emitting structure, but also light converted by a wavelength converter, such as a phosphor.

In another exemplary embodiment, the light emitting diode chip may further include a substrate disposed opposite to the DBR with the light emitting structure interposed between the DBR and the substrate.

The light emitting structure may emit visible light or near ultraviolet light having a peak wavelength of 440 nm or less.

As used herein, the terms "high index of refraction" and "low index of refraction" are used to indicate a difference in refractive indices between the first material layers and the second material layers. In particular, the first material layers of a low refractive index may have a lower refractive index than the second material layers having a high refractive index. In an exemplary embodiment, the first material layers may be $SiO_2$ layers and the second material layers may be $TiO_2$ layers. For example, with respect to light having a wavelength of 400 nm, the $SiO_2$ layers may have a refractive index of about 1.492, and the $TiO_2$ layers may have a refractive index of about 2.677. However, the inventive concepts are not limited to particular materials of the first material layers and the second material layers. For example, as long as the first material layers and the second material layers have different refractive indices and are optically transparent, not only insulation layers but also semiconductor layers may be used as the first and second material layers. Here, dielectric layers, such as the $SiO_2$ layers and the $TiO_2$ layers are more suitable due to high light transmittance, easy deposition, and relatively large difference in refractive indices.

A stop band width of the DBR may be in a range of 100 nm to 200 nm. As used herein, the term "stop band" refers to a reflection band which exhibits a reflectance of 90% or more in the reflectance spectrum depending on wavelengths for convenience.

Hereinafter, exemplary embodiments will be described in more detail with reference to the accompanying drawings.

Figure 4A:
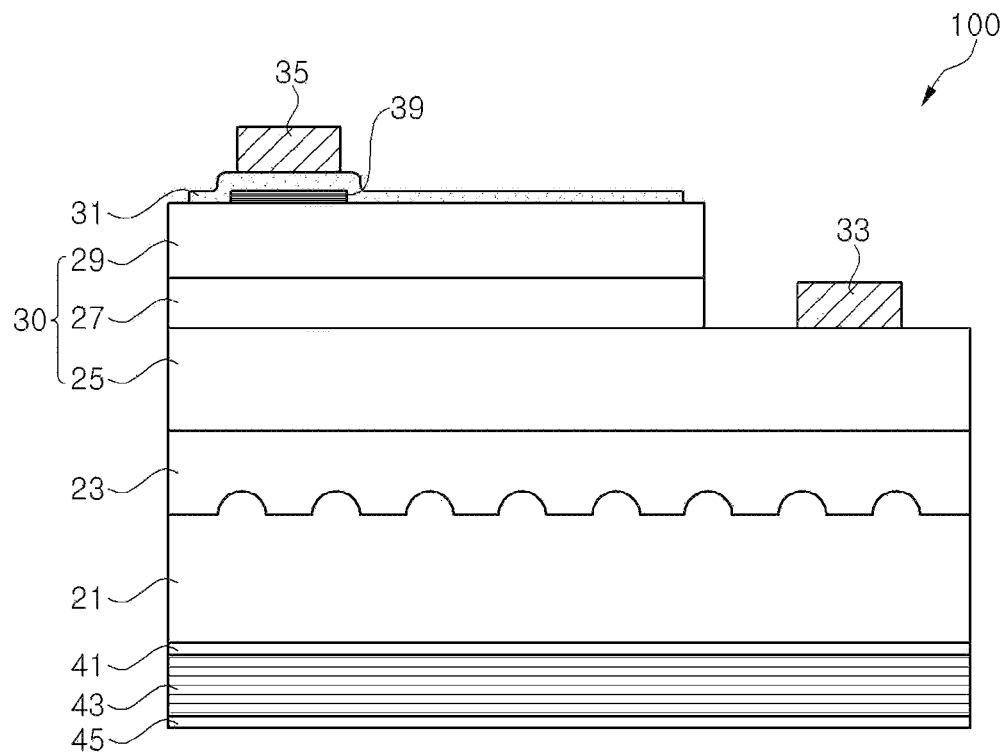
FIG. 4A is a cross-sectional view of a light emitting diode chip according to an exemplary embodiment.

FIG. 4A is a cross-sectional view of a light emitting diode chip according to an exemplary embodiment.

Referring to FIG. 4A, the light emitting diode chip 100 includes a substrate 21, a light emitting structure 30, and a DBR 43. The light emitting diode chip 100 may further include a buffer layer 23, a transparent electrode layer 31, a first electrode pad 33, a second electrode pad 35, a current blocking layer 39, an interface layer 41, and a metal reflection layer 45.

The substrate 21 may be any transparent substrate without limitation, and may be, for example, a sapphire substrate or a SiC substrate. In some exemplary embodiments, the substrate 21 may be a substrate capable of growing GaN-based compound semiconductor layers thereon. For example, the substrate 21 may have a predetermined pattern formed on an upper surface thereof, like a patterned sapphire substrate (PSS). Since the patterned sapphire substrate generally allows light to enter through a bottom surface thereof at an incident angle in the range of 20° to 50°, the DBR according to an exemplary embodiment may improve efficiently when applied thereto.

The light emitting structure 30 is disposed on an upper surface of the substrate 21. The light emitting structure 30 includes a first conductivity type semiconductor layer 25, a second conductivity type semiconductor layer 29, and an active layer 27 interposed between the first and second conductivity type semiconductor layers 25 and 29. Here, the first conductivity type and the second conductivity type are opposite conductivity types, and the first conductivity type may be an n-type and the second conductivity type may be a p-type, or vice versa.

The first conductivity type semiconductor layer 25, the active layer 27, and the second conductivity type semiconductor layer 29 may be formed of GaN-based compound semiconductor materials, such as, (Al, In, Ga)N. Compositional elements and a composition of the active layer 27 may be determined so that the active layer 27 can emit light having a desired wavelength, for example, UV light or blue light. In particular, the active layer 27 may be formed to emit visible light or near ultraviolet light having a peak wavelength of 440 nm or less.

As shown in the drawings, the first conductivity type semiconductor layer 25 and/or the second conductivity type semiconductor layer 29 may have a single layer or a multilayer structure. In addition, the active layer 27 may have a single quantum well structure or a multi-quantum well structure. Further, the buffer layer 23 may be interposed between the substrate 21 and the first conductivity type semiconductor layer 25.

The semiconductor layers 25, 27, and 29 may be formed by MOCVD or MBE, and the first conductivity type semiconductor layer 25 may be subjected to patterning to expose some regions thereof through photolithography and etching.

The transparent electrode layer 31 may be formed on the second conductivity type semiconductor layer 29 using, for example, ITO, ZnO or Ni/Au. The transparent electrode layer 31 may have a lower specific resistance than the second conductivity type semiconductor layer 29, and thus, may spread electric current. The first electrode pad 33, for example, an n-electrode pad 33, is formed on the first conductivity type semiconductor layer 25, and the second electrode pad 35, for example, a p-electrode pad 35, is formed on the transparent electrode layer 31. As shown in the drawings, the p-electrode pad 35 may be electrically connected to the second conductivity type semiconductor layer 29 through the transparent electrode layer 31.

The current blocking layer 39 is disposed between the second electrode pad 35 and the second conductivity type semiconductor layer 29. The current blocking layer 39 may be disposed under the transparent electrode layer 31, or may be disposed on the transparent electrode layer 31. When the current blocking layer 39 is disposed between the transparent electrode layer 31 and the electrode pad 35, the electrode pad 35 may be electrically connected to the transparent electrode layer 31 through an extension, for example.

The current blocking layer 39 may reflect light generated in the active layer 27 and traveling towards the second electrode pad 35. The current blocking layer 39 may be formed to have a high reflectance with respect to light generated in the active layer 27, and may include a distributed Bragg reflector, in which dielectric layers having different refractive indices, for example, $TiO_2$ layers and $SiO_2$ layers, are alternately stacked one above another. In this manner, light loss due to absorption of light by the second electrode pad 35 may be prevented, thereby improving luminous efficacy of the light emitting diode chip.

The DBR 43 is disposed at a lower side of the substrate 21. More particularly, the substrate 21 is interposed between the light emitting structure 30 and the DBR 43. The DBR 43 is formed by alternately stacking first material layers having a first refractive index (low index of refraction), for example, $SiO_2$ layers (n: about 1.492@400 nm), and second material layers having a second refractive index (high index of refraction), for example, $TiO_2$ layers (n: about 2.677@400 nm). The stack structure of the DBR 43 will be described below in more detail with reference to FIG. 5.

The interface layer 41 may be interposed between the substrate 21 and the DBR 43. The interface layer 41 may be formed of substantially the same material as the first material layer, for example, $SiO_2$. The interface layer 41 may prevent the DBR 43 formed on the bottom surface of the substrate 21 from being affected by the surface state of the bottom surface of the substrate 21, and may be thicker than the first material layers. For example, the interface layer 41 may have a thickness of 300 nm to 500 nm, for example, about 400 nm.

The metal reflection layer 45 may cover the DBR 43. The metal reflection layer 45 may include, for example, Al or Ag. The light emitting diode chip 100 may provide relatively high reflectance over light in a wide wavelength range by including the metal reflection layer 45 and the DBR together. However, the inventive concepts are not limited thereto, and in some exemplary embodiments, the metal reflection layer 45 may be omitted. In this case, the last layer of the DBR 43 may be a lower surface layer of the light emitting diode chip 100.

In the illustrated exemplary embodiment, the DBR 43 is disposed to oppose the light emitting structure 30 with respect to the substrate 21. As such, light generated in the active layer 27 is reflected by the DBR 43 to be emitted in the upwards direction from the light emitting diode chip 100.

Figure 4B:
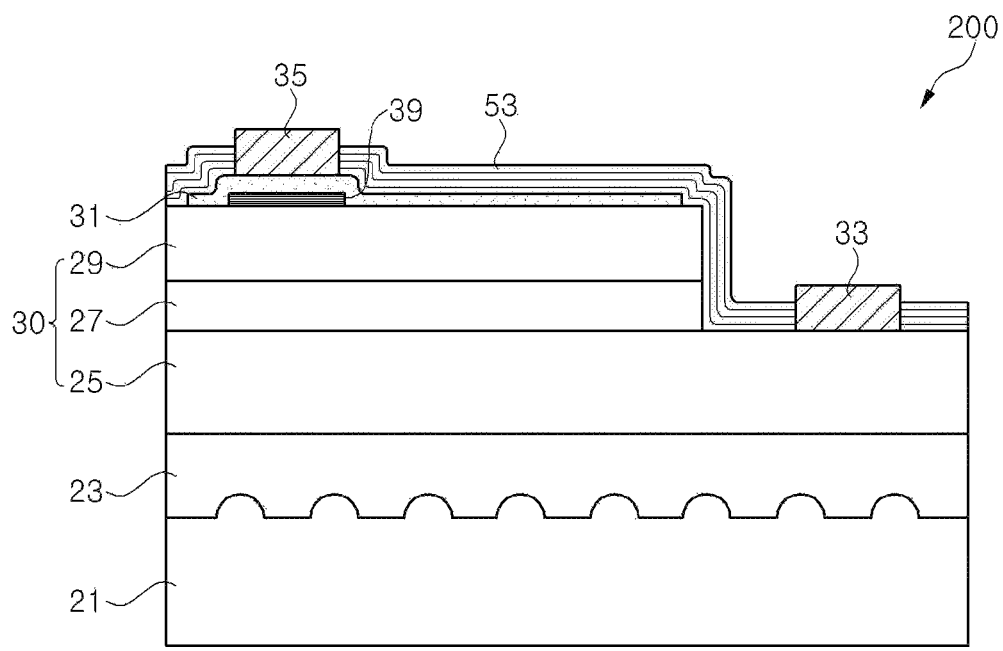
FIG. 4B is a cross-sectional view of a light emitting diode chip according to another exemplary embodiment.

FIG. 4B is a cross-sectional view of a light emitting diode chip according to another exemplary embodiment.

Referring to FIG. 4B, a DBR 53 according to an exemplary embodiment is generally similar to the DBR 43 of FIG. 4A, except that the DBR 53 is disposed to opposite the substrate 21 with respect to the light emitting structure 30. As shown in FIG. 4B, the DBR 53 may cover a transparent electrode layer 31 and an exposed surface of the first conductivity type semiconductor layer 25. The DBR 53 reflects light generated in the active layer 27 towards the substrate 21. The structure of the DBR 53 will be described below in more detail with reference to FIG. 5.

The light emitting diode chip 200 may be, for example, a flip-chip type light emitting diode chip. As such, detailed shapes and locations of the transparent electrode layer 31, an n-electrode pad 33, and a p-electrode pad 35 may be modified suitable for the flip-chip type light emitting diode chip.

As described with reference to FIG. 4A and FIG. 4B, the DBR 43 or 53 may be formed on the lower surface of the substrate 21 or an upper surface of the light emitting structure 30. In some exemplary embodiments, the DBR may be interposed between the substrate 21 and the light emitting structure 30. In this case, the DBR may be formed by, for example, semiconductor layers.

Figure 5:
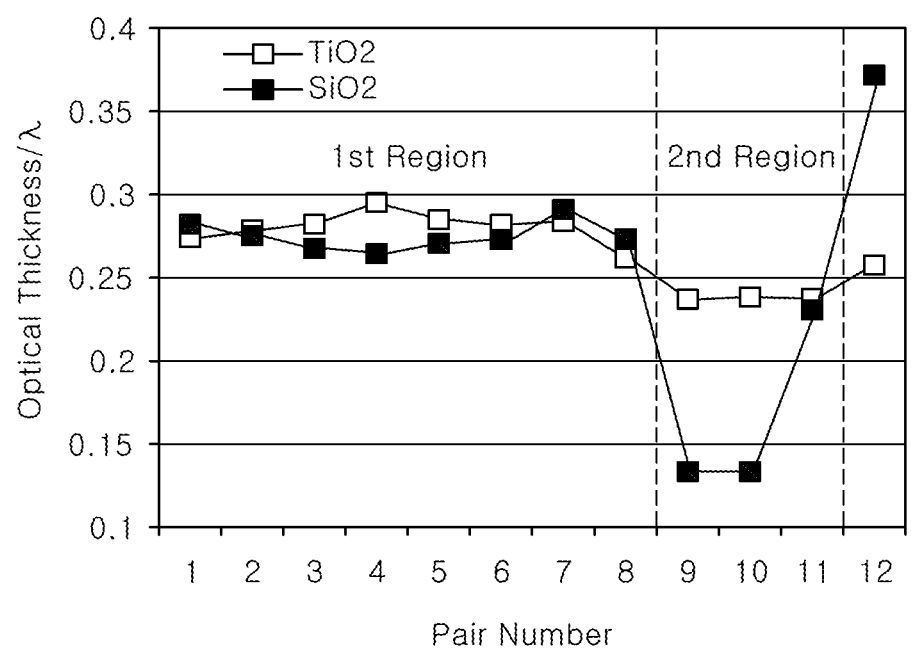
FIG. 5 is a graph depicting optical thicknesses of $TiO_2$/$SiO_2$ pairs depending upon locations for illustrating a DBR structure according to an exemplary embodiment.

FIG. 5 is a graph depicting optical thicknesses of $TiO_2$/$SiO_2$ pairs depending upon location for illustrating a DBR structure according to an exemplary embodiment. As used herein, the optical thickness refers to a thickness with respect to a peak wavelength of light emitted from the light emitting diode chip, and the peak wavelength of light emitted from the light emitting diode chip is referred to as a central wavelength.

The sequence of forming the first material layers and the second material layers of the DBR may be variously changed according to conditions. For example, as shown in FIG. 4A, when the interface layer 41 is formed of substantially the same material as the first material layers (for example, $SiO_2$), the first layer of the DBR 43 may be the second material layer. Alternatively, when the interface layer 41 is omitted, the first layer of the DBR 43 may be the first material layer. In addition, as shown in FIG. 4B, when the interface layer 41 is omitted, the first layer of the DBR 53 may be the first material layer or the second material layer. In general, since the adhesive strength of the $SiO_2$ layer is greater than that of the $TiO_2$ layer, the $SiO_2$ layer may be used as a layer to be attached to the substrate 21 or the light emitting structure 30.

The last layer formed on the surface of the DBR 43 or 53 has a relatively high thickness in order to protect the DBR 43 or 53, and may be formed of substantially the same material as the first material layer.

FIG. 5 shows the DBR 43 disposed on the interface layer 41, in which the first layer of the DBR 43 is the second material layer ($TiO_2$ layer) and the last layer of the DBR 43 is the first material layer ($SiO_2$ layer). In this case, the pairs are made in a sequence of the second material layer ($TiO_2$ layer)/first material layer ($SiO_2$ layer).

Referring to FIG. 5, it can be confirmed that the structure of the DBR is clearly divided into a first region, a second region, and the last pair. The first region is placed closer to the light emitting structure 30 than the second region.

The first region may increase reflectance near the central wavelength (e.g. λ: 400 nm λ) and in a spectrum region having a longer wavelength than the central wavelength (λ). The first material layers and the second material layers in the first region generally have an optical thickness greater than 0.25λ, as shown in FIG. 5.

More specifically, in the first region, all of the first material layers ($SiO_2$ layer) and the second material layers ($TiO_2$ layer) have optical thicknesses greater than 0.25λ and less than 0.25λ+20% (that is, 0.3λ). As such, a difference in thickness between the first material layer and the second material layer in each pair in the first region may not exceed a maximum of 0.05λ. As such, light loss from to the second material layer may be prevented by forming the thickness of the second material layers to be 0.3λ or less.

Further, each pair in the first region may include a pair, in which a first material layer is thicker than a second material layer, and another pair of a first material layer thinner than a second material layer.

By setting the first and second material layers disposed closer to the light emitting structure 30 in the first region thicker than 0.25λ, it is possible to shift the stop band of the reflectance spectrum toward a longer wavelength side. Accordingly, the high reflectance may be secured even for light having a large incident angle. However, since the reflectance of light having an incident angle of 0° may be decreased, if the stop band is excessively shifted toward the longer wavelength side, the thicknesses of the first material layers and the second material layers may be 0.3λ or less to prevent the stop band from being excessively shifted.

The number of pairs in the first region may be limited in consideration of light loss due to the second material layers. For example, the number of pairs in the first region may be 6 to 10.

The second region is disposed between the first region and the last pair. The second region may reduce light absorption by the second material layer, and increase the reflectance of the DBR. The optical thicknesses of the first and second material layers in the second region may be smaller than 0.25λ.

More specifically, the second material layers (e.g. $TiO_2$ layers) in the second region have optical thicknesses smaller than 0.25λ and greater than 0.25λ−20%. Further, the second material layers in the second region may have optical thicknesses greater than 0.25λ−10%. In addition, the optical thickness deviation of the second material layers in the second region may be less than that of the second material layers in the first region.

The first material layers (e.g. $SiO_2$ layers) in the second region may have a thickness deviation greater than that of the second material layers in the second region. For example, the first material layers may include a layer having an optical thickness of less than 0.25λ and greater than 0.25λ–20%, and a layer having an optical thickness of less than 0.25λ–40%. Further, the first material layer having the optical thickness greater than 0.2λ–20% may have an optical thickness greater than 0.25λ–10%. However, the first material layer having the optical thickness less than 0.25λ–40% may have an optical thickness greater than 0.25λ–50%.

While the second material layers having the high refractive index in the second region may be formed to a greater thickness deviation than the first material layers, since an actual thickness of the second material layers is excessively thin, it may be difficult to realize the DBR. For example, the second material layer ($TiO_2$ layer) having an optical thickness of about 0.13λ is only about 20 nm in actual (or physical) thickness, as thus, it is difficult to uniformly deposit such a thin layer. However, the first material layer ($SiO_2$ layer) having the optical thickness of about 0.13λ is about 36 nm in actual thickness, and is relatively thicker than the second material layer.

The number of pairs in the second region may not exceed ½ of the number of pairs in the first region. For example, the number of pairs in the second region may be, for example, 3 to 5.

In the last pair of the DBR 43, the first material layer may be the last layer of the DBR, and thus, may be the surface layer of the DBR. The last layer may be formed to be thicker, for example, a thickness in a range of 80 nm to 200 nm, more specifically within a range of 90 nm to 120 nm, than other first material layers in the DBR.

When the light emitting diode chip 100 is packaged, the last layer of the DBR may mitigate an influence to the DBR from the surface state of the mounting surface, to which the light emitting diode chip 100 is mounted.

The second material layer in the last pair has an optical thickness near 0.25λ, and may have an optical thickness in a range of 0.25λ–10% to 0.25λ+10%, for example.

By adding the second region and the last pair to the first region, the reflectance by the first region may be improved as a whole.

According to the illustrated exemplary embodiment, by forming the first and second material layers in the first region, which is disposed relatively closer to the light emitting structure 30, to have a relatively thick optical thicknesses, it is possible to effectively reflect incident light having a large incident angle from the substrate. Furthermore, by adding the second region and the last pair, the total reflectance of the DBR 43 may be improved.

Moreover, by reducing the thickness of the second material layers in the second region to less than 0.25λ, light loss due to the second material layers may be reduced.

The optical thickness of each of layers forming the DBR can be adjusted using a simulation tool, such as Macleod® or Filmstar®. In addition, each of the material layers of the DBR can be formed on the bottom surface of the substrate 21 or on the upper surface of the light emitting structure 30 using an ion assist deposition apparatus.

Figure 6A:
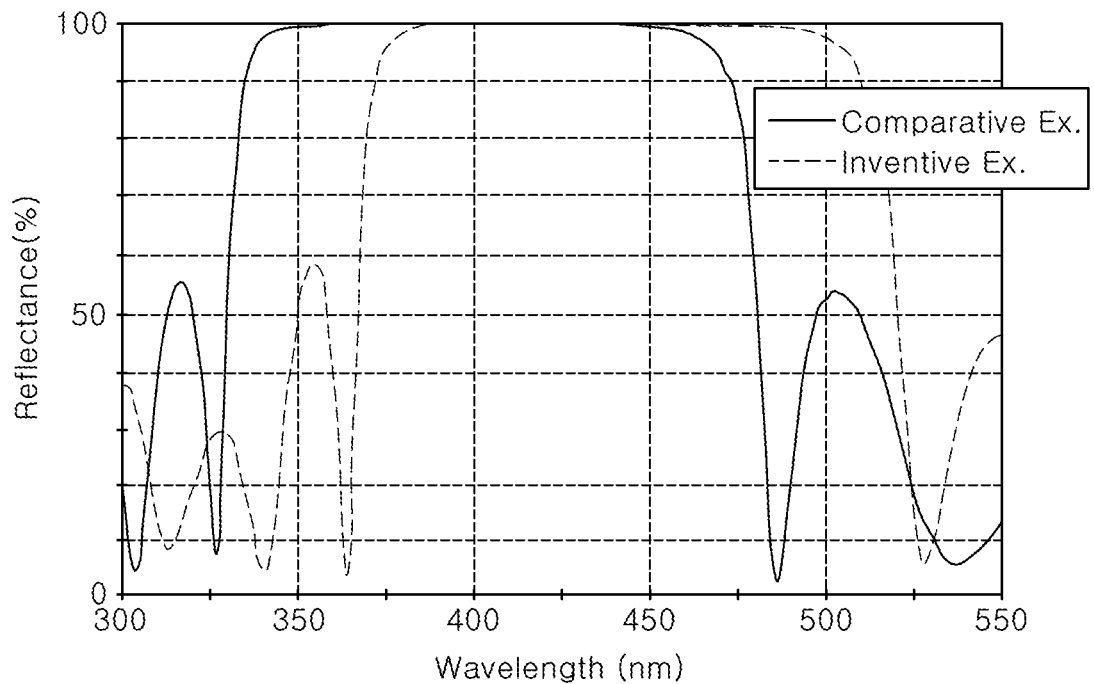
FIG. 6A is a simulation graph depicting reflectance depending on wavelengths of a DBR set to 8 pairs for light having an incident angle of 0°.
Figure 6B:
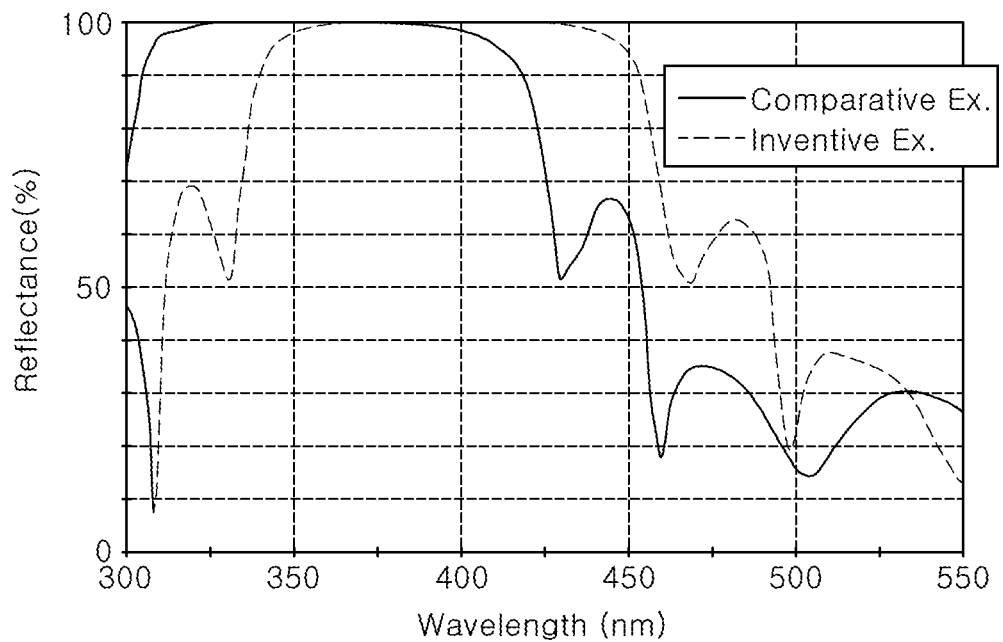
FIG. 6B is a simulation graph depicting reflectance depending on wavelengths of a DBR set to 8 pairs for light having an incident angle of 20°.

FIG. 6A and FIG. 6B are simulation graphs depicting reflectance depending on wavelengths of DBRs set to 8 pairs for light having an incident angle of 0° and 20°, respectively. A comparative example shows a DBR including the first material layers ($SiO_2$ layers) and the second material layers ($TiO_2$ layers), which are both to set to optical thicknesses of 0.25λ, and an inventive example shows a DBR including the first and second material layers ($SiO_2$/$TiO_2$ layers) of the first region shown in FIG. 5

Referring to FIG. 6A, the DBR of the comparative example having both the first material layer and the second material layer set to 0.25λ with respect to the central wavelength of 400 nm shows a reflectance graph having a stop band of about 150 nm with respect to 400 nm for light having an incident angle of 0°. In contrast, the DBR of the inventive example shows the reflectance graph having a stop band of about 150 nm based on about 440 nm.

Referring to FIG. 6B, for light having the incident angle of 20°, in the comparative example, it is observed that the central wavelength of the stop band is about 360 nm, which is shifted about 40 nm toward a short wavelength side. In the inventive example, it is observed that the central wavelength of the stop band is shifted towards 400 nm. More particularly, the comparative example has the low reflectance for light having the incident angle of 20° near 400 nm and light having a longer wavelength than 400 nm. On the other hand, in the inventive example, since the center of the stop band is located near about 400 nm with respect to light having the incident angle of 20°, it is possible to maintain the high reflectance for light having near 400 nm wavelength and incident on the reflective surface at the incident angle of 20°.

Figure 7A:
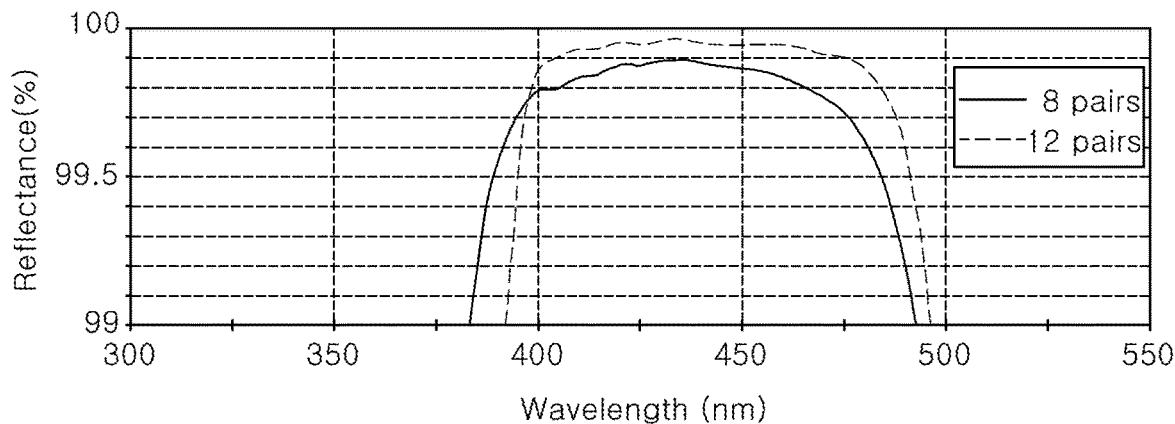
FIG. 7A is a simulation graph showing reflectance depending on wavelengths of a DBR set to 8 pairs (first region) and a DBR set to 12 pairs (first region+second region+last pair) for light having an incident angle of 0°.
Figure 7B:
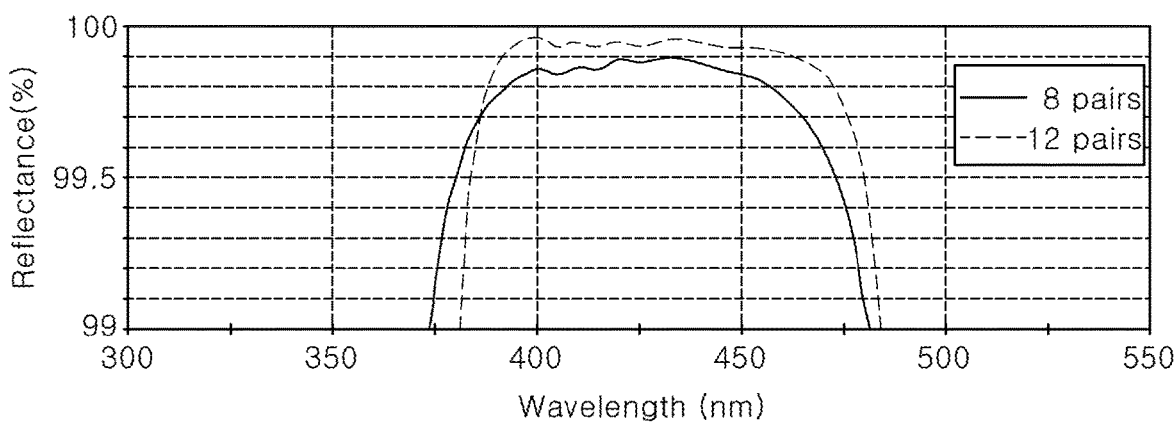
FIG. 7B is a simulation graph showing reflectance depending on wavelengths of a DBR set to 8 pairs (first region) and a DBR set to 12 pairs (first region+second region+last pair) for light having an incident angle of 10°.
Figure 7C:
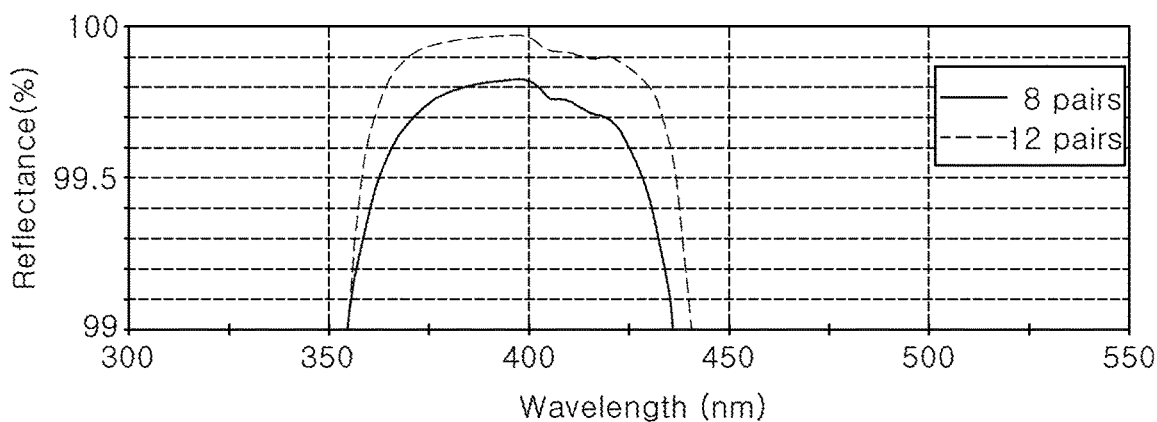
FIG. 7C is a simulation graph showing reflectance depending on wavelengths of a DBR set to 8 pairs (first region) and a DBR set to 12 pairs (first region+second region+last pair) for light having the incident angle of 20°.

FIG. 7A, FIG. 7B, and FIG. 7C are simulation graphs showing reflectance depending on wavelengths of a DBR set to 8 pairs (first region) and a DBR set to 12 pairs (first region+second region+last pair) for light having an incident angle of 0°, 10°, and 20°, respectively.

As shown in FIGS. 7A, 7B and 7C, for each of the cases where the incident angles are 0°, 10°, and 20°, as compared to the graphs shown in FIGS. 6A and 6B, it can be confirmed that the reflectance is improved by adding the second region and the last pair.

Although the $SiO_2$ layer and the $TiO_2$ layer are described as the first material layer and the second material layer, respectively, the inventive concepts are not limited thereto, and other insulation layers or semiconductor layers may be used as the first and second material layers in some exemplary embodiments.

Figure 8:
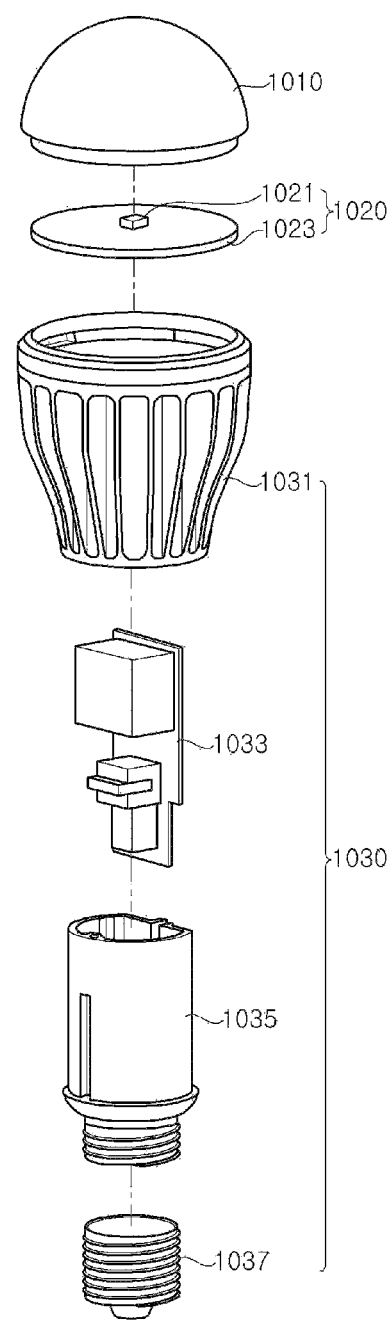
FIG. 8 is an exploded perspective view of a lighting apparatus according to an exemplary embodiment.

FIG. 8 is an exploded perspective view of a lighting apparatus, to which a light emitting device (a light emitting diode chip) according to an exemplary embodiment is applied.

Referring to FIG. 8, the lighting apparatus according to the illustrated example embodiment includes a diffusive cover 1010, a light emitting diode module 1020, and a body 1030. The body 1030 may receive the light emitting diode module 1020, and the diffusive cover 1010 may be disposed on the body 1030 to cover an upper side of the light emitting diode module 1020.

The body 1030 may have any shape so long as the body can supply electric power to the light emitting diode module 1020 while receiving and supporting the light emitting diode module 1020. For example, as shown in the drawing, the body 1030 may include a body case 1031, a power supply 1033, a power supply case 1035, and a power source connection section 1037.

The power supply 1033 is received in the power supply case 1035 to be electrically connected to the light emitting diode module 1020, and may include at least one IC chip. The IC chip may regulate, change or control electric power supplied to the light emitting diode module 1020. The power supply case 1035 may receive and support the power supply 1033. The power supply case 1035 having the power supply 1033 secured therein may be disposed within the body case 1031. The power source connection section 1037 is disposed at a lower end of the power supply case 1035 and coupled thereto. Accordingly, the power source connection section 1037 is electrically connected to the power supply 1033 within the power supply case 1035 and may serve as a passage through which power can be supplied from an external power source to the power supply 1033.

The light emitting diode module 1020 includes a substrate 1023 and a light emitting device 1021 disposed on the substrate 1023. The light emitting diode module 1020 may be disposed at an upper portion of the body case 1031 and electrically connected to the power supply 1033.

Any substrate capable of supporting the light emitting device 1021 may be used as the substrate 1023 without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting device 1021 may include at least one of the light emitting devices according to the embodiments described above.

The diffusive cover 1010 is disposed on the light emitting device 1021 and may be secured to the body case 1031 to cover the light emitting device 1021. The diffusive cover 1010 may be formed of a light-transmitting material, and light orientation of the lighting apparatus may be adjusted through regulation of the shape and optical transmissivity of the diffusive cover 1010. As such, the diffusive cover 1010 may be modified in various shapes depending on usage and applications of the lighting apparatus.

Figure 9:
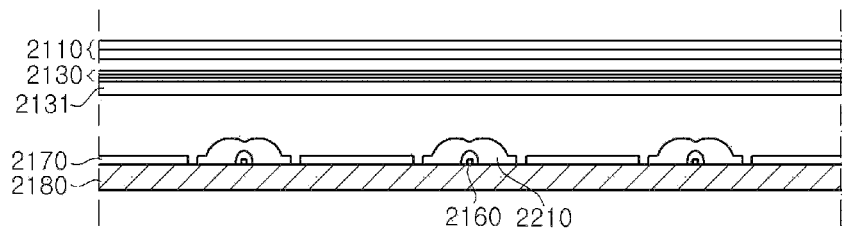
FIG. 9 is a cross-sectional view of a display according to an exemplary embodiment.

FIG. 9 is a cross-sectional view of a display to which a light emitting device (a light emitting diode chip) according to an exemplary embodiment is applied.

The display according to the illustrated exemplary embodiment includes a display panel 2110, a backlight unit supplying light to the display panel 2110, and a panel guide supporting a lower edge of the display panel 2110.

The display panel 2110 is not particularly limited and may be, for example, a liquid crystal panel including a liquid crystal layer. Gate driving PCBs may be further disposed at the edge of the display panel 2110 to supply driving signals to a gate line. Here, the gate driving PCBs may be formed on a thin film transistor substrate instead of being formed on separate PCBs.

The backlight unit includes a light source module, which includes at least one substrate and a plurality of light emitting devices 2160. The backlight unit may further include a bottom cover 2180, a reflective sheet 2170, a diffusive plate 2131, and optical sheets 2130.

The bottom cover 2180 may be open at an upper side thereof to receive the substrate, the light emitting devices 2160, the reflective sheet 2170, the diffusive plate 2131, and the optical sheets 2130. In addition, the bottom cover 2180 may be coupled to the panel guide. The substrate may be disposed under the reflective sheet 2170 to be surrounded by the reflective sheet 2170. Alternatively, when a reflective material is coated onto a surface thereof, the substrate may be disposed on the reflective sheet 2170. Further, a plurality of substrates may be arranged parallel to one other. However, it should be understood that other implementations are also possible, and the light source module may include a single substrate.

The light emitting devices 2160 may include at least one of the light emitting devices according to the exemplary embodiments described above. The light emitting devices 2160 may be regularly arranged in a predetermined pattern on the substrate. In addition, a lens 2210 may be disposed on each of the light emitting devices 2160 to improve uniformity of light emitted from the plurality of light emitting devices 2160.

The diffusive plate 2131 and the optical sheets 2130 are disposed on the light emitting devices 2160. Light emitted from the light emitting devices 2160 may be supplied in the form of sheet light to the display panel 2110 through the diffusive plate 2131 and the optical sheets 2130.

In this manner, the light emitting devices according to the exemplary embodiments may be applied to direct type displays like the display according to the illustrated exemplary embodiment.

Figure 10:
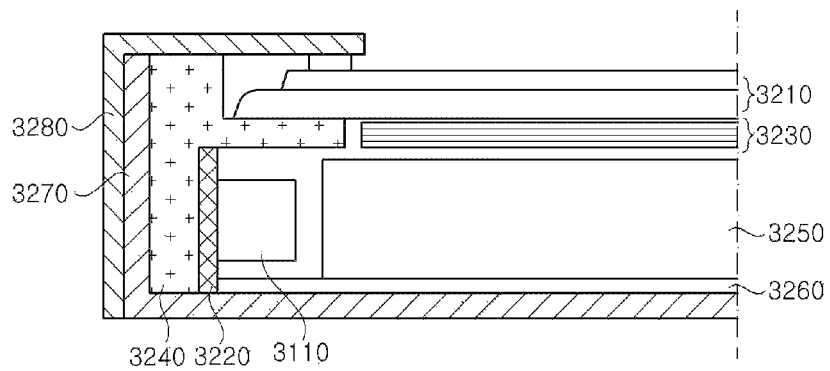
FIG. 10 is a cross-sectional view a display according to another exemplary embodiment.

FIG. 10 is a cross-sectional view of a display to which a light emitting device (a light emitting diode chip) according to an exemplary embodiment is applied.

The display according to the illustrated exemplary embodiment includes a display panel 3210 on which an image is displayed, and a backlight unit disposed at a rear side of the display panel 3210 and emitting light thereto. Further, the display includes a frame 240 supporting the display panel 3210 and receiving the backlight unit, and covers 3240 and 3280 surrounding the display panel 3210.

The display panel 3210 is not particularly limited and may be, for example, a liquid crystal panel including a liquid crystal layer. A gate driving PCB may be further disposed at an edge of the display panel 3210 to supply driving signals to a gate line. Here, the gate driving PCB may be formed on a thin film transistor substrate instead of being formed on a separate PCB. The display panel 3210 is secured by the covers 3240 and 3280 disposed at upper and lower sides thereof, and the cover 3280 disposed at the lower side of the display panel 3210 may be coupled to the backlight unit.

The backlight unit supplying light to the display panel 3210 includes a lower cover 3270 partially open at an upper side thereof, a light source module disposed at one side inside the lower cover 3270, and a light guide plate 3250 disposed parallel to the light source module and converting spot light into sheet light. In addition, the backlight unit according to this embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting diodes 3110 arranged at constant intervals on one surface of the substrate 3220. As the substrate 3220, any substrate capable of supporting the light emitting diodes 3110 and being electrically connected thereto may be used without limitation. For example, the substrate 3220 may include a printed circuit board. The light emitting diodes 3110 may include at least one of the light emitting devices according to the exemplary embodiments described above. Light emitted from the light source module enters the light guide plate 3250 and is supplied to the display panel 3210 through the optical sheets 3230. The light guide plate 3250 and the optical sheets 3230 convert spot light emitted from the light emitting diodes 3110 into sheet light.

In this manner the light emitting devices according to the exemplary embodiments may be applied to edge type displays like the display according to the illustrated exemplary embodiment.

Figure 11:
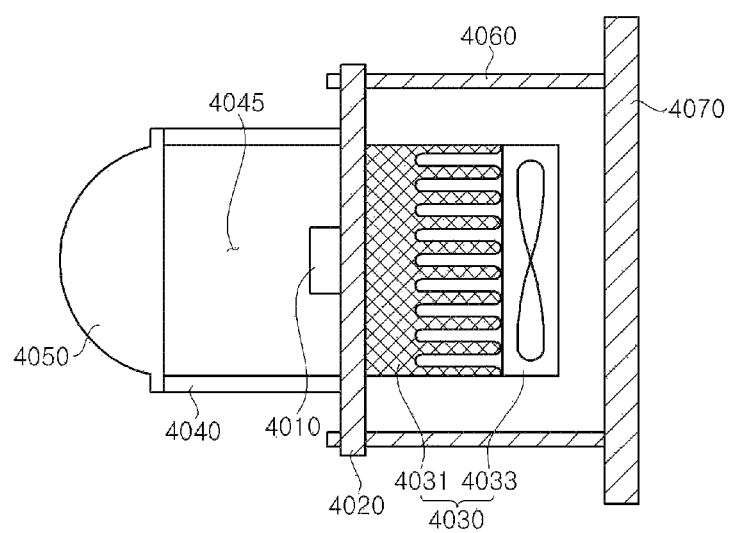
FIG. 11 is a cross-sectional view of a headlight according to an exemplary embodiment.

FIG. 11 is a cross-sectional view of a headlight to which a light emitting device (a light emitting diode chip) according to an exemplary embodiment is applied.

Referring to FIG. 11, the headlight according to the illustrated exemplary embodiment includes a lamp body 4070, a substrate 4020, a light emitting device 4010, and a cover lens 4050. The headlight may further include a heat dissipation unit 4030, a support rack 4060, and a connection member 4040.

The substrate 4020 is secured by the support rack 4060 and disposed above the lamp body 4070. As the substrate 4020, any member capable of supporting the light emitting device 4010 may be used without limitation. For example, the substrate 4020 may include a substrate having a conductive pattern, such as a printed circuit board. The light emitting device 4010 is disposed on the substrate 4020 and may be supported and secured by the substrate 4020. In addition, the light emitting device 4010 may be electrically connected to an external power source through the conductive pattern of the substrate 4020. Further, the light emitting device 4010 may include at least one of the light emitting devices according to the exemplary embodiments described above.

The cover lens 4050 is disposed on a path of light emitted from the light emitting device 4010. For example, as shown in the drawing, the cover lens 4050 may be spaced apart from the light emitting device 4010 by the connection member 4040 and may be disposed in a direction of supplying light emitted from the light emitting device 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting device 4010, and thus, may act as a light guide that provides a luminous path 4045. The connection member 4040 may be formed of a light reflective material or coated therewith. On the other hand, the heat dissipation unit 4030 may include heat dissipation fins 4031 and/or a heat dissipation fan 4033, and dissipates heat generated upon operation of the light emitting device 4010.

In this manner, the light emitting devices according to the exemplary embodiments may be applied to headlights, particularly, headlights for vehicles, like the headlight according to this embodiment.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting diode chip comprising:
    a light emitting structure including an active layer; and
    a distributed Bragg reflector (DBR) disposed on one side of the light emitting structure to reflect light emitted from the light emitting structure, the DBR including first material layers having a low refractive index and second material layers having a high refractive index alternately disposed one over another,
    wherein, with respect to a peak wavelength $\lambda$ of light emitted from the light emitting structure, the DBR comprises:
        a first region including a plurality of pairs of the first and second material layers, each of the first and second material layers in the first region having an optical thickness greater than $0.25\lambda$ and less than $0.3\lambda$;
        a last pair of the first and second material layers disposed farthest from the light emitting structure; and
        a second region disposed between the first region and the last pair and including a plurality of pairs of the first and second material layers, each of the first material layers and the second material layers in the second region has an optical thickness less than $0.25\lambda$,
    wherein the first region is disposed closer to the light emitting structure than the second region,
    wherein the first region is directly adjacent to the second region, and
    wherein the first material layers in the second region have a greater optical thickness deviation than that of the second material layers in the second region.

2. The light emitting diode chip of claim 1, wherein one of the pairs in the first region has a first material layer thicker than a second material layer, and another one of the pairs has a first material layer thinner than a second material layer.

3. The light emitting diode chip of claim 1, wherein at least one of the first material layers in the second region has an optical thickness greater than $0.25\lambda-20\%$, and at least one of the first material layers in the second region has an optical thickness less than $0.25\lambda-40\%$.

4. The light emitting diode chip of claim 3, wherein the second material layers in the second region have optical thicknesses greater than $0.25\lambda-10\%$.

5. The light emitting diode chip of claim 3, wherein the at least one of the first material layers in the second region having the optical thickness greater than $0.25\lambda-20\%$ has an optical thickness greater than $0.25\lambda-10\%$.

6. The light emitting diode chip of claim 3, wherein the optical thickness deviation of the second material layers in the second region is smaller than that of the second material layers in the first region.

7. The light emitting diode chip of claim 1, wherein the first material layer of the last pair is thicker than the first material layers in the first and second regions.

8. The light emitting diode chip of claim 7, wherein the first material layer of the last pair has a thickness in a range of about 80 nm to about 200 nm.

9. The light emitting diode chip of claim 1, wherein the number of pairs in the first region is in a range of 6 to 10.

10. The light emitting diode chip of claim 9, wherein the number of pairs in the second region is ½ or less of the number of pairs in the first region.

11. The light emitting diode chip of claim 1, further comprising a substrate disposed between the light emitting structure and the DBR.

12. The light emitting diode chip of claim 11, wherein the substrate comprises a patterned sapphire substrate (PSS).

13. The light emitting diode chip of claim 11, further comprising an interface layer disposed between the substrate and the DBR, the interface layer comprising substantially the same material as the first material layers and has a greater thickness than the first material layers.

14. The light emitting diode chip of claim 13, further comprising a metal reflector contacting the last pair of the DBR.

15. The light emitting diode chip of claim 1, further comprising a substrate,
    wherein the light emitting structure is interposed between the DBR and the substrate.

16. The light emitting diode chip of claim 1, wherein the light emitting structure is configured to emit visible light or near ultraviolet light having a peak wavelength of 440 nm or less.

17. The light emitting diode chip of claim 1, wherein the first material layers comprise $SiO_2$ layers and the second material layers comprise $TiO_2$ layers.

18. The light emitting diode chip of claim 1, wherein a stop band width of the DBR is in a range of about 100 nm to about 200 nm.

19. A light emitting diode chip comprising:
a light emitting structure including an active layer; and
a distributed Bragg reflector (DBR) disposed on the light emitting structure and comprising a plurality first material layers and second material layers alternatively disposed one over another, each of the second material layers has a greater refractive index than the first material layers,
wherein:
the DBR sequentially includes a first region, a second region, and a third region, the first region being disposed closer to the light emitting structure than the second and third regions;
each of the first, second, and third regions includes at least one pair of first and second material layers;
each of the first material layers in the second region has an optical thickness less than those of the first material layers in the first and third regions; and
each of the second material layers in the second region has an optical thickness less than those of the second material layers in the first and third regions.

20. The light emitting diode chip of claim 19, wherein the first material layer having the greatest optical thickness is disposed in the third region, and the second material layer having the greatest optical thickness is disposed in the first region.

* * * * *